(12) United States Patent
Hayashi

(10) Patent No.: US 8,802,576 B2
(45) Date of Patent: Aug. 12, 2014

(54) SEMICONDUCTOR DEVICE AND METHOD OF MANUFACTURING THE SAME

(75) Inventor: Yumi Hayashi, Zama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/570,436

(22) Filed: Aug. 9, 2012

(65) Prior Publication Data

US 2013/0119550 A1　May 16, 2013

(30) Foreign Application Priority Data

Nov. 14, 2011　(JP) ................. 2011-248750

(51) Int. Cl.
*H01L 21/31*　(2006.01)
*H01L 23/48*　(2006.01)

(52) U.S. Cl.
USPC .......................................... 438/773; 257/774

(58) Field of Classification Search
USPC ........... 438/618, 597, 584; 257/773, 774, 618
See application file for complete search history.

(56) References Cited

U.S. PATENT DOCUMENTS

| | | | |
|---|---|---|---|
| 2006/0211235 A1* | 9/2006 | Usami | 438/618 |
| 2009/0096007 A1* | 4/2009 | Omura et al. | 257/316 |
| 2009/0302367 A1* | 12/2009 | Nagano | 257/316 |
| 2010/0038617 A1* | 2/2010 | Nakajima et al. | 257/2 |

FOREIGN PATENT DOCUMENTS

| | | |
|---|---|---|
| JP | 2-231722 | 9/1990 |
| JP | 9-17786 | 1/1997 |
| JP | 2000-277524 | 10/2000 |
| JP | 2008-205366 | 9/2008 |

* cited by examiner

*Primary Examiner* — Julio J Maldonado
*Assistant Examiner* — Moin Rahman
(74) *Attorney, Agent, or Firm* — Oblon, Spivak, McClelland, Maier & Neustadt, L.L.P.

(57) ABSTRACT

In one embodiment, a method of manufacturing a semiconductor device includes sequentially forming a first insulator, a second insulator, and a sacrificial layer on a semiconductor substrate, and forming plural core materials from the sacrificial layer and the second insulator. The method further includes forming first and second interconnects on side surfaces of each core material to form plural first interconnects and plural second interconnects alternately, each first interconnect having a first side surface in contact with a core material and a second side surface positioned on an opposite side of the first side surface, and each second interconnect having a third side surface in contact with a core material and a fourth side surface positioned on an opposite side of the third side surface. The method further includes removing the sacrificial layer so that the second insulator remains, after the first and second interconnects are formed.

11 Claims, 10 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2011-248750, filed on Nov. 14, 2011, the entire contents of which are incorporated herein by reference.

FIELD

Embodiments described herein relate to a semiconductor device and a method of manufacturing the same.

BACKGROUND

In recent years, sidewall interconnects have been studied to form fine interconnects exceeding the limit of lithography. For example, the sidewall interconnects are formed on both sidewalls of a core material which is formed of insulator. In this case, it is considered to reduce the capacitance between the sidewall interconnects by removing the core material after the sidewall interconnects are formed and forming an insulator with a low permittivity or an air gap between the sidewall interconnects, However, when the core material is removed, there is a high probability that the sidewall interconnects fall down. Therefore, a technique which can achieve reduction in capacitance between the interconnects while preventing falling of the interconnects is needed.

DETAILED DESCRIPTION

Embodiments will now be explained with reference to the accompanying drawings.

In one embodiment, a method of manufacturing a semiconductor device includes sequentially forming a first insulator, a second insulator, and a sacrificial layer on a semiconductor substrate, and forming a plurality of core materials from the sacrificial layer and the second insulator. The method further includes forming first and second interconnects on side surfaces of each core material to form a plurality of first interconnects and a plurality of second interconnects alternately on the first insulator, each first interconnect having a first side surface in contact with a core material and a second side surface positioned on an opposite side of the first side surface, and each second interconnect having a third side surface in contact with a core material and a fourth side surface positioned on an opposite side of the third side surface. The method further includes removing the sacrificial layer so that the second insulator remains, after the first and second interconnects are formed.

First Embodiment

Figure 1:
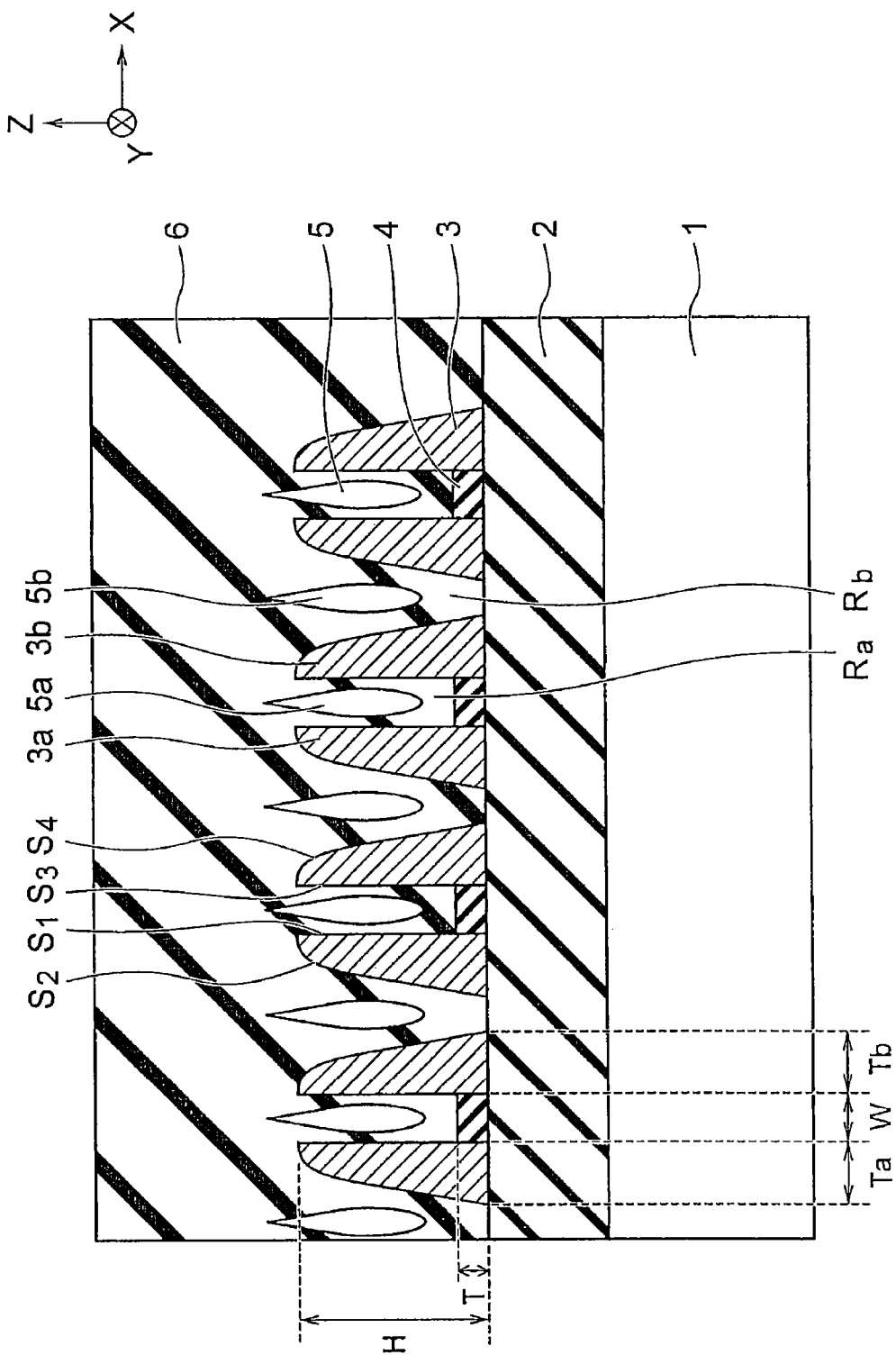
FIG. 1 is a cross sectional view showing a structure of a semiconductor device of a first embodiment.

FIG. 1 is a cross sectional view showing a structure of a semiconductor device of a first embodiment.

The device in FIG. 1 includes a semiconductor substrate 1, a first insulator 2, sidewall interconnects 3, second insulators 4, air gaps 5, and a third insulator 6.

The semiconductor substrate 1 is, for example, a silicon substrate. FIG. 1 shows directions X and Y which are parallel to a principal surface of the semiconductor substrate 1 and are perpendicular to each other, and a direction Z which is perpendicular to the principal surface of the semiconductor substrate 1.

The first insulator 2 is formed on the semiconductor substrate 1. The first insulator 2 is, for example, an inter layer dielectric. The first insulator 2 may be formed directly on the semiconductor substrate 1 or may be formed on the semiconductor substrate 1 via another layer. Examples of the first insulator 2 include a silicon nitride (SiN) layer, a silicon oxide ($SiO_2$) layer, a silicon oxycarbide (SiOC) layer and the like.

The sidewall interconnects 3 are formed on the first insulator 2, and include first interconnects 3a and second interconnects 3b. In FIG. 1, the first and second interconnects 3a and 3b are alternately disposed along the direction X.

Each first interconnect 3a has a first side surface $S_1$ which is almost parallel to the direction Z, and a second side surface $S_2$ which is positioned on the opposite side of the first side surface $S_1$ and inclines more than the first side surface $S_1$. Each second interconnect 3b has a third side surface $S_3$ which is almost parallel to the direction Z, and a fourth side surface $S_4$ which is positioned on the opposite side of the third side surface $S_3$ and inclines more than the third side surface $S_3$. As shown in FIG. 1, the first side surface $S_1$ of each first interconnect 3a faces the third side surface $S_3$ of a second interconnect 3b which is adjacent in a positive X direction. The second side surface $S_2$ of each first interconnect 3a faces the fourth side surface $S_4$ of a second interconnect 3b which is adjacent in a negative X direction.

Examples of a material of the sidewall interconnects 3 include an elemental substance of metal such as Ti, Ni, Co, W, Mo, Ru, Ta and Al, an alloy containing one or more kinds of those metallic elements, and a metallic compound containing one or more kinds of those metallic elements (e.g., TIN). Other examples of the sidewall interconnects 3 include a silicide layer containing substances such as Ti, Ni, Co and W, and a polysilicon layer doped with impurities such as boron, phosphorus and arsenic.

Reference sign Ra shown in FIG. 1 represents first regions between the first and third side surfaces $S_1$ and $S_3$, and reference sign Rb represents second regions between the second and fourth side surfaces $S_2$ and $S_4$.

The second insulators 4 are formed in the first regions Ra without being formed in the second regions Rb. Therefore, every two regions between the sidewall interconnects 3 includes one second insulator 4. Each second insulator 4 is disposed in a bottom portion of a first region Ra so that the second insulator 4 is partially in contact with the first and third side surfaces $S_1$ and $S_3$. In other words, each second insulator 4 is disposed in the bottom portion of the first region Ra without being disposed in a top portion of the first region Ra. Examples of the second insulators 4 include silicon nitride layers, silicon oxide layers, silicon oxycarbide layers and the like.

The air gaps 5 are formed in the first and second regions Ra and Rb. Hereinafter, the air gaps 5 in the first regions Ra are referred to as first air gaps 5a, and the air gaps 5 in the second regions Rb are referred to as second air gaps 5b.

The third insulator 6 is formed on the sidewall interconnects 3, and includes the first and second air gaps 5a and 5b in the first and second regions Ra and Rb, respectively. The third insulator 6 is, for example, an inter layer dielectric. The third insulator 6 may be formed directly on the sidewall interconnects 3, or may be formed on the sidewall interconnects 3 via another layer (e.g., sidewall protection layer). In this embodiment, a material of the third insulator 6 is an insulating material with poor embeddability.

(1) Advantages of Second Insulators 4

As described above, the second insulators 4 in the present embodiment are disposed in the first regions Ra without being disposed in the second regions Rb. In addition, the second insulators 4 in the present embodiment are disposed in the bottom portions of the first regions Ra without being disposed in the top portions of the first regions Ra. Such a structure provides following advantages.

Firstly, since each second insulator 4 is disposed between a side surface $S_1$ of a first interconnect 3a and a third side surface $S_3$ of a second interconnect 3b, it becomes possible to prevent those interconnects 3a and 3b from falling to the first region Ra side. In other words, the second insulator 4 can function as a layer to prevent the falling of the interconnects 3a and 3b.

Secondly, the following advantage is realized by disposing the second insulators 4 not in the entire first regions Ra but only in the bottom portions of the first regions Ra. If the second insulators 4 are disposed in the entire first regions Ra, the falling of the interconnects 3a and 3b can be prevented, but an insulator with a low permittivity or air gaps cannot be formed in the first regions Ra. However, since the second insulators 4 in the present embodiment is disposed only in the bottom portions of the first regions Ra, the insulator with the low permittivity or the air gaps can be formed on the second insulators 4 in the first regions Ra as well as in the second regions Rb with preventing the falling of the interconnects 3a and 3b. Therefore, according to the present embodiment, capacitances between the sidewall interconnects 3 can be reduced with preventing the falling of the sidewall interconnects 3.

Thirdly, since the second insulators 4 are disposed only in the bottom portions of the first regions Ra, the capacitances between the sidewall interconnects 3 can be controlled uniformly by adjusting the material and thickness of the second insulators 4. Hereinafter, this third advantage will be described in detail.

As shown in FIG. 1, the first and second interconnects 3a and 3b are different in shape. More specifically, they are almost mirror-symmetrical in shape to each other. Therefore, the capacitance between the first and third side surfaces $S_1$ and $S_3$ is generally different from the capacitance between the second and fourth side surfaces $S_2$ and $S_4$ even when distances and materials between those surfaces are identical. In addition, if the first and second air gaps 5a and 5b are respectively formed in the first and second regions Ra and Rb without disposing the second insulators 4, the size of the first air gaps 5a becomes larger than the size of the second air gaps 5b. This also influences the difference in the capacitances between the sidewall interconnects 3.

On the other hand, a resistance of the first interconnects 3a is almost identical to a resistance of the second interconnects 3b since those interconnects 3a and 3b are almost mirror-symmetrical in shape to each other. In general, it is preferable that the interconnect resistances and the capacitances between the sidewall interconnects 3 are uniform in an interconnect region.

Accordingly, in the present embodiment, the structure of the insulators or the size of the first air gaps 5a in the first regions Ra are adjusted by adjusting the material and thickness of the second insulators 4. Therefore, in the present embodiment, the capacitances between the sidewall interconnects 3 can be adjusted in response to the interconnect shape, the distance between the sidewall interconnects 3, the material between the sidewall interconnects 3 and the like. This makes it possible to uniformly control the capacitances between the sidewall interconnects 3 in the interconnect region. FIG. 1 shows the first and second air gaps 5a and 5b adjusted to have approximately the same size.

Figure 2:
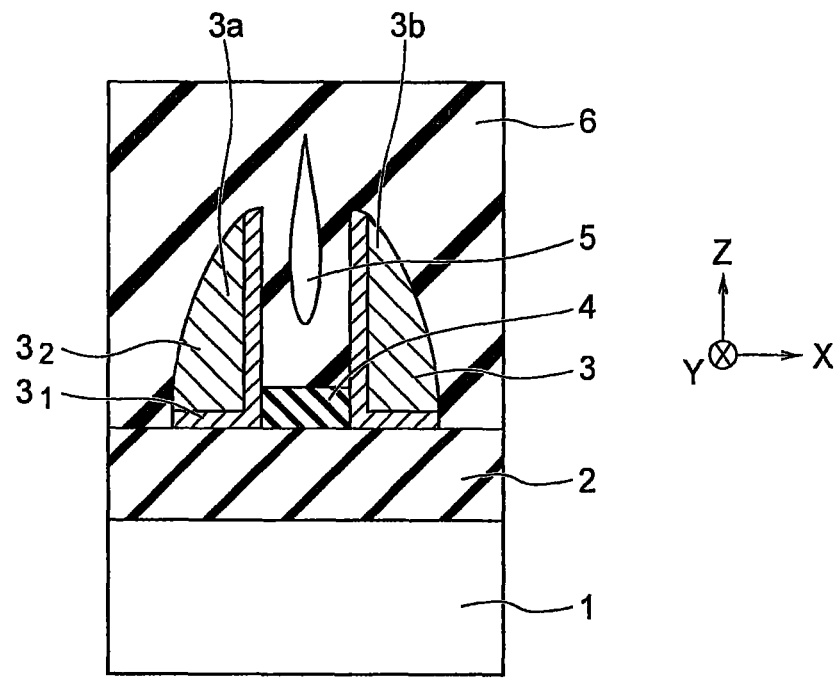
FIGS. 2 and 3 are cross sectional views showing structures of semiconductor devices of modifications of the first embodiment.
Figure 3:
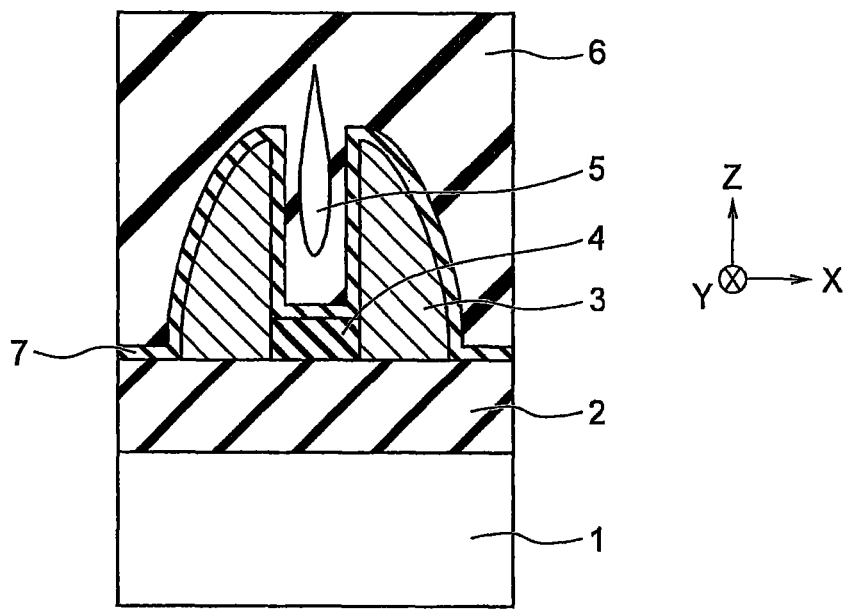

In the present embodiment, structures shown in FIGS. 2 and 3 may also be applied. FIGS. 2 and 3 are cross sectional views showing the structures of semiconductor devices of modifications of the first embodiment.

In FIG. 2, each sidewall interconnect 3 includes a barrier metal layer $3_1$ exposed to the first side surface $S_1$ or the third side surface $S_3$ and to its bottom surface, and an interconnect material $3_2$ formed on the barrier metal layer $3_1$. The sidewall interconnect 3 with such a structure can be formed by sequentially forming the barrier metal layer $3_1$ and the interconnect material $3_2$ on the side surface of a later-described core material.

In FIG. 3, the side surfaces $S_1$ to $S_4$ of the sidewall interconnects 3 are coated with a sidewall protection layer 7 for protecting the sidewall interconnects 3 from oxidization and the like. The sidewall protection layer 7 is, for example, a silicon nitride layer or a silicon oxide layer. The thickness of the sidewall protection layer 7 is, for example, 10 nm or less. The sidewall protection layer 7 of FIG. 3 can be formed by forming an insulator to be the sidewall protection layer 7 on the entire surface of the semiconductor substrate 1, after the removal of a later-described sacrificial layer.

(2) Sizes of Sidewall Interconnects 3 and Second Insulators 4

The sizes of the sidewall interconnects 3 and the second insulators 4 are now described with reference to FIG. 1 again.

Reference sign "W" shown in FIG. 1 denotes a width of the second insulators 4. Reference signs "Ta" and "Tb" denote widths (thicknesses) of the first and second interconnects 3a and 3b, respectively. In the present embodiment, the thicknesses "Ta" and "Tb" of the first and second interconnects 3a and 3b are set to be, for example, the same value as the width "W" of the second insulators 4.

Reference sign "H" denotes a height of the sidewall interconnects 3. If the height "H" is too large, the sidewall interconnects 3 might fall down. If the height "H" is too small, the resistances of the sidewall interconnects 3 might be too high. Accordingly, in the present embodiment, the height "H" of the sidewall interconnects 3 is set at, for example, 2 to 10 times the thicknesses "Ta" and "Tb" of the sidewall interconnects 3.

Reference sign "T" denotes a thickness of the second insulators 4. If the thickness "T" is too small, the sidewall interconnects 3 might fall down. If the thickness "T" is too large, the size of the first air gaps 5a might become too small. Accordingly, in the present embodiment, the thickness "T" of the second insulators 4 is set at, for example, 0.2 to 0.5 times the height "H" of the sidewall interconnects 3.

The sizes "W", "Ta", "Tb", "H" and "T" may take values different from those in the foregoing examples in response to the materials and shapes of the sidewall interconnects 3 and the second insulators 4 and the like.

(3) Method of Manufacturing Semiconductor Device

A method of manufacturing the semiconductor device is now described with reference to FIGS. 4A to 6B. FIGS. 4A to 6B are cross sectional views showing the method of manufacturing the semiconductor device of the first embodiment.

Figure 4A:
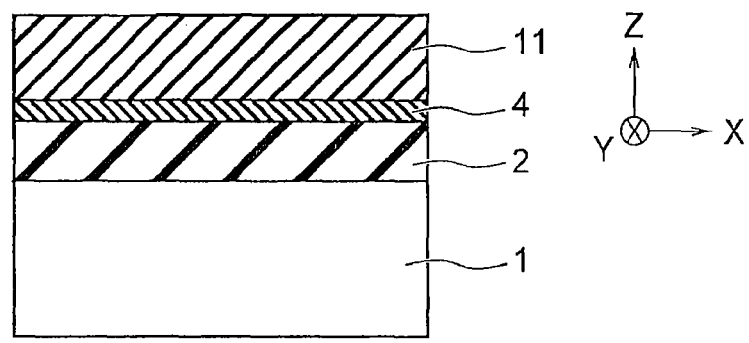
FIGS. 4A to 6B are cross sectional views showing a method of manufacturing a semiconductor device of the first embodiment.

First, as shown in FIG. 4A, the first insulator 2, the second insulator 4 and a sacrificial layer 11 are sequentially formed on the semiconductor substrate 1. The sacrificial layer 11 may be an insulator or a layer other than the insulator. However, the material of the sacrificial layer 11 in the present embodiment is different from the material of the second insulator 4. Examples of the sacrificial layer 11 include a silicon nitride layer, a silicon oxide layer, a silicon oxycarbide layer, a silicon layer, an organic material layer and the like.

Figure 4B:
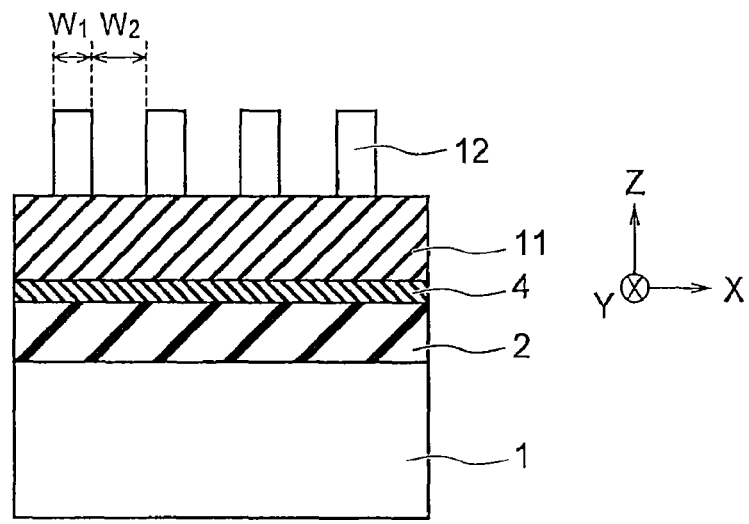

Next, as shown in FIG. 4B, a resist layer 12 is formed on the sacrificial layer 11, and the resist layer 12 is then patterned. Reference signs "$W_1$" and "$W_2$" denote an interconnect width and a space width of the resist pattern, respectively. In the present embodiment, those widths "$W_1$" and "$W_2$" are set, for example, at 50 nm or less. In the present embodiment, the resist layer 12 may be replaced with an insulating layer such as a hard mask layer processed with an upper resist pattern as a mask.

Figure 4C:
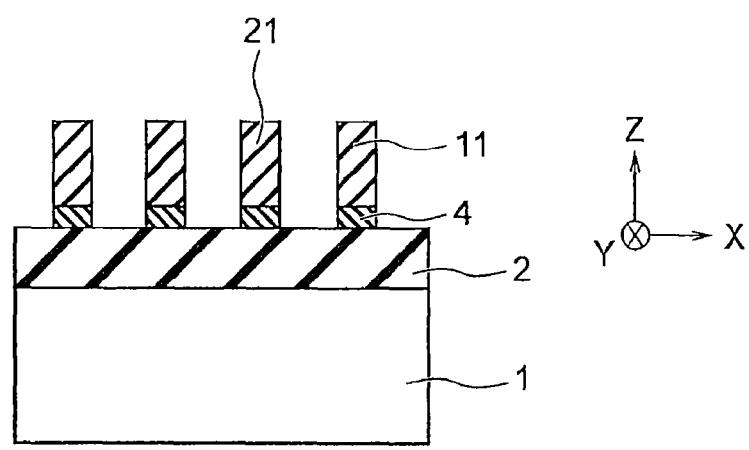

As shown in FIG. 4C, the sacrificial layer 11 and the second insulator 4 are then etched by using the resist layer 12 as a mask. As a result, a plurality of core materials 21 are formed from the sacrificial layer 11 and the second insulator 4.

Figure 5A:
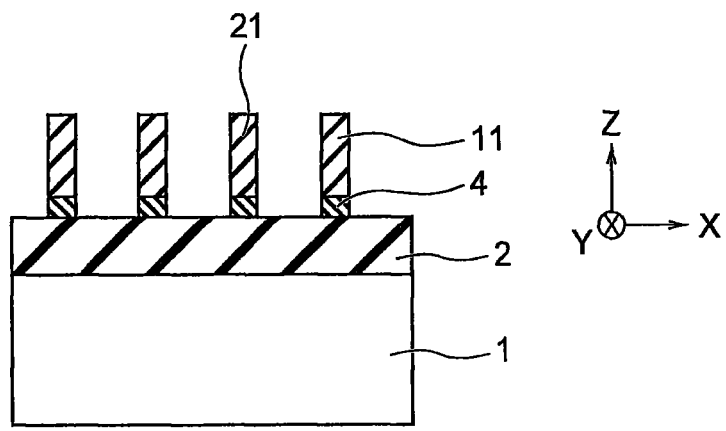

As shown in FIG. 5A, the core materials 21 are then slimmed by wet etching or the like so that the width of the core materials 21 is reduced by half. When the sacrificial layer 11 is an Si layer, a mixed aqueous solution of HF and $HNO_3$ is used as a wet etching solution for slimming the sacrificial layer 11, for example. When the sacrificial layer 11 is an SiN layer, an $H_3PO_4$ aqueous solution is used as the wet etching solution, for example. When the sacrificial layer 11 is an $SiO_2$ or SiOC layer, an HF aqueous solution or a mixed aqueous solution of HF and $NH_4F$ is used as the wet etching solution, for example. This also applies to the slimming of the second insulator 4.

Figure 5B:
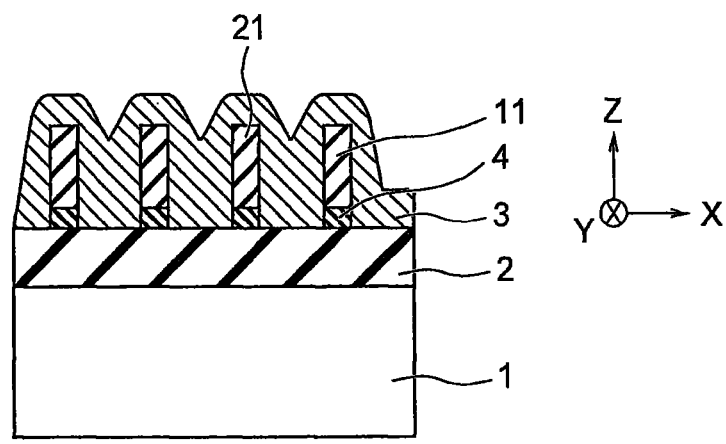

As shown in FIG. 5B, an interconnect material 3 to be the sidewall interconnects is then formed on the entire surface of the semiconductor substrate 1. As a result, the interconnect material 3 is formed on side and upper surfaces of the core materials 21. When forming the interconnect material 3, it is preferable to apply a method and a condition which promote the formation of the interconnect material 3 on the side surfaces of the core materials 21. For example, when the interconnect material 3 is formed by physical vapor deposition (PVD), it is preferable to adjust a bias voltage so that the interconnect material 3 is formed on the side surfaces of the core materials 21.

Figure 5C:
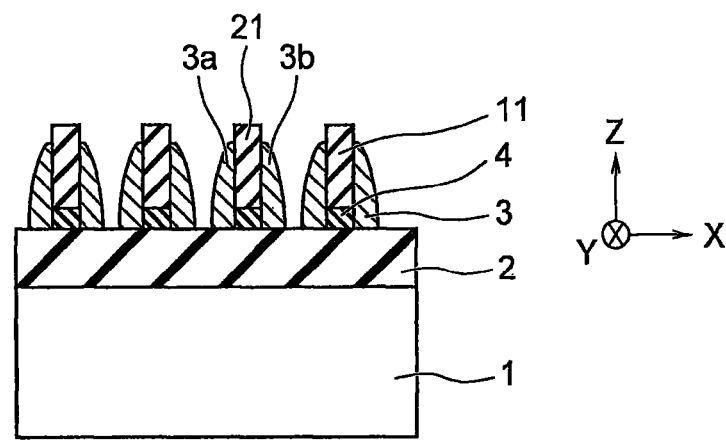

As shown in FIG. 5C, the interconnect material 3 is then etched so that the interconnect material 3 remains only on the side surfaces of the core materials 21. As a result, the sidewall interconnects 3 are formed on the side surfaces of the core materials 21. More specifically, the first and second interconnects 3a and 3b are formed on the side surfaces of each core material 21.

The side surfaces of the sidewall interconnects 3 which are in contact with the core materials 21 correspond to the first and third side surfaces $S_1$ and $S_3$ of FIG. 1, and the side surfaces of the interconnects opposite to those side surfaces correspond to the second and forth side surface $S_2$ and $S_4$ of FIG. 1.

Figure 6A:
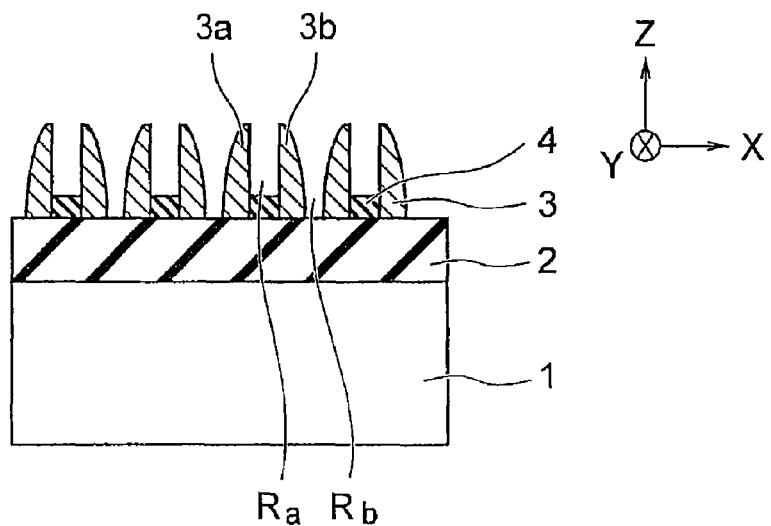

As shown in FIG. 6A, the sacrificial layers 11 included in the core materials 21 are then removed by wet etching or the like. In this case, the sacrificial layers 11 are removed so that the second insulators 4 remain. The second insulators 4 may remain in its entirety or in part. When the sacrificial layers 11 are Si, SiN, $SiO_2$ or SiOC layers, the same solution as that for the slimming is used as a wet etching solution, for example. When the sacrificial layers 11 are organic material layers, the sacrificial layers 11 may be removed by ashing, for example.

In the present embodiment, the sidewall protection layer 7 of FIG. 3 may be formed on the entire surface of the semiconductor substrate 1 after the step of FIG. 6A.

Figure 6B:
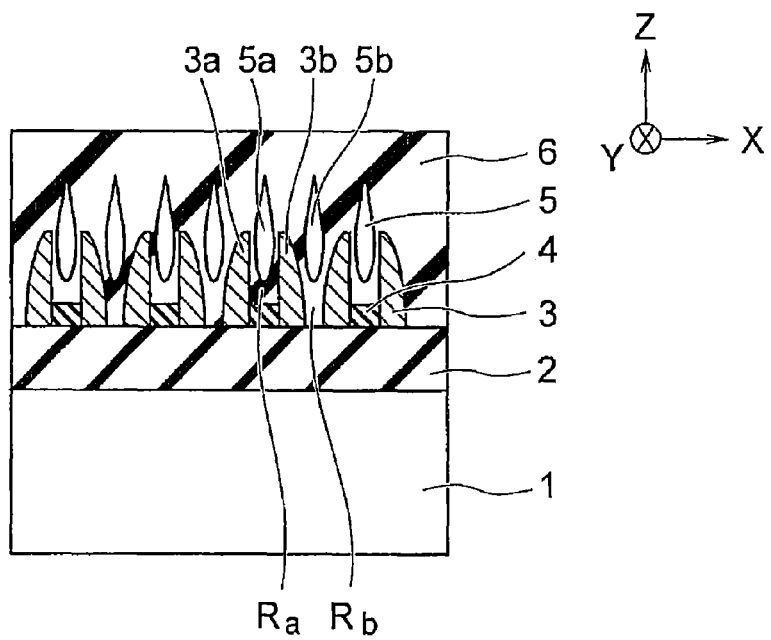

As shown in FIG. 6B, the third insulator 6 is then formed on the entire surface of the semiconductor substrate 1. As a result, the sidewall interconnects 3 are coated with the third insulator 6, and the first and second air gaps 5a and 5b are formed in the first and second regions Ra and Rb, respectively.

In this way, the semiconductor device of FIG. 1 is manufactured.

The material of the second insulator 4 may be different from the material of the first insulator 2, or may be identical to the material of the first insulator 2. In the former case, the timing to stop the etching of the second insulator 4 in the step of FIG. 4C is controlled by using the etching selectivity of the first and second insulators 2 and 4. In the latter case, the timing to stop the etching of the second insulator 4 in the step of FIG. 4C is controlled based on etching time.

The material of the third insulator 6 may be different from the materials of the first and second insulators 2 and 4, or may be identical to the materials of the first and second insulators 2 and 4. Each of the first to third insulators 2, 4 and 6 may be a single-layer film which is made of a single insulating material, or may be a multilayer film formed by stacking plural insulating materials.

(4) Modification of Method of Manufacturing Semiconductor Device

Figure 7A:
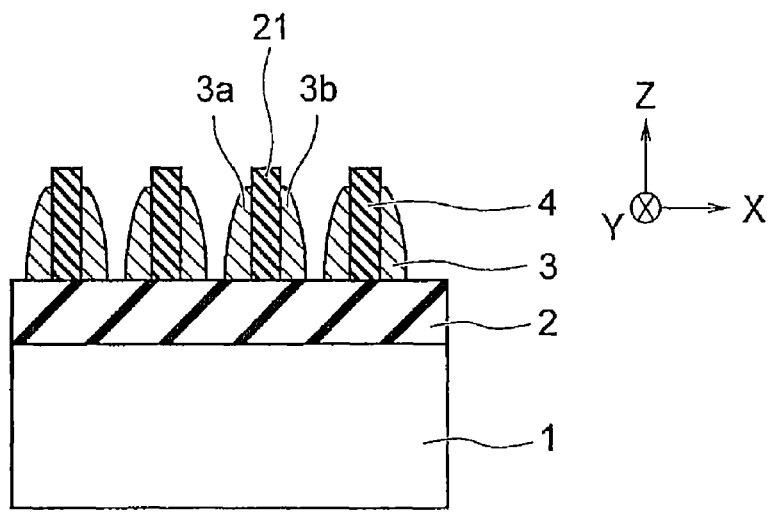
FIGS. 7A and 7B are cross sectional views showing a method of manufacturing a semiconductor device of a modification of the first embodiment.
Figure 7B:
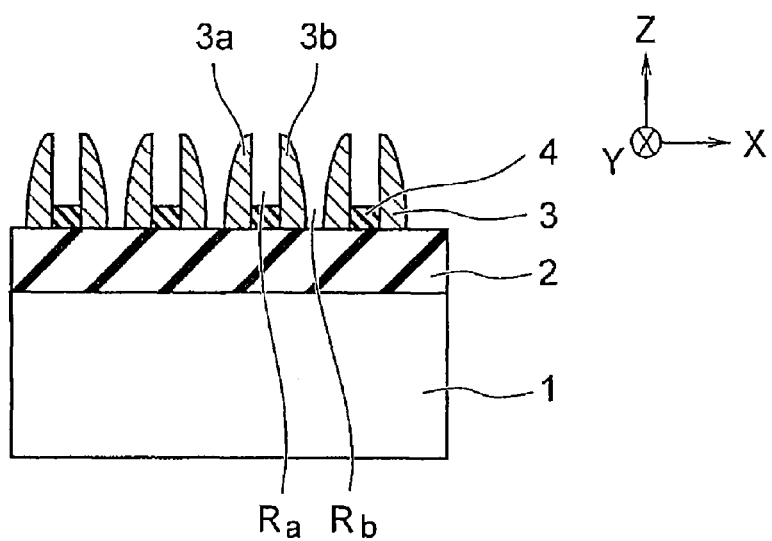

A modification of the method of manufacturing the semiconductor device is now described with reference to FIGS. 7A and 7B. FIGS. 7A and 7B are cross sectional views showing the method of manufacturing the semiconductor device of the modification of the first embodiment.

In the present modification, only the first and second insulators 2 and 4 are formed on the semiconductor substrate 1 in the step of FIG. 4A. The steps of FIGS. 4B to 5C are then performed. As a result, as shown in FIG. 7A, the sidewall interconnects 3 are formed on the side surfaces of the core materials 21 which is formed only with the second insulators 4.

As shown in FIG. 7B, the second insulators 4 are then partially removed by wet etching or the like. As a result, the interconnect structure similar to that of FIG. 6A is achieved. The timing to stop the etching of the second insulators 4 is controlled based on etching time.

The step of FIG. 6B is then performed. In this way, the semiconductor device of FIG. 1 can also be manufactured in the present modification.

(5) Effects of First Embodiment

Finally, the effects of the first embodiment will be described.

As described above, the second insulators 4 in the present embodiment are disposed in the first regions Ra without being disposed in the second regions Rb. In addition, the second insulators 4 in the present embodiment are disposed in the bottom portions of the first regions Ra without being disposed in the top portions of the first regions Ra.

Therefore, according to the present embodiment, it becomes possible to reduce the capacitances between the sidewall interconnects 3 while preventing the falling of the sidewall interconnects 3. The second insulators 4 can prevent not only the falling of the sidewall interconnects 3 in the step of FIG. 6A but also the falling of the sidewall interconnects 3 in the steps subsequent to the step of FIG. 6A.

Second Embodiment

Figure 8:
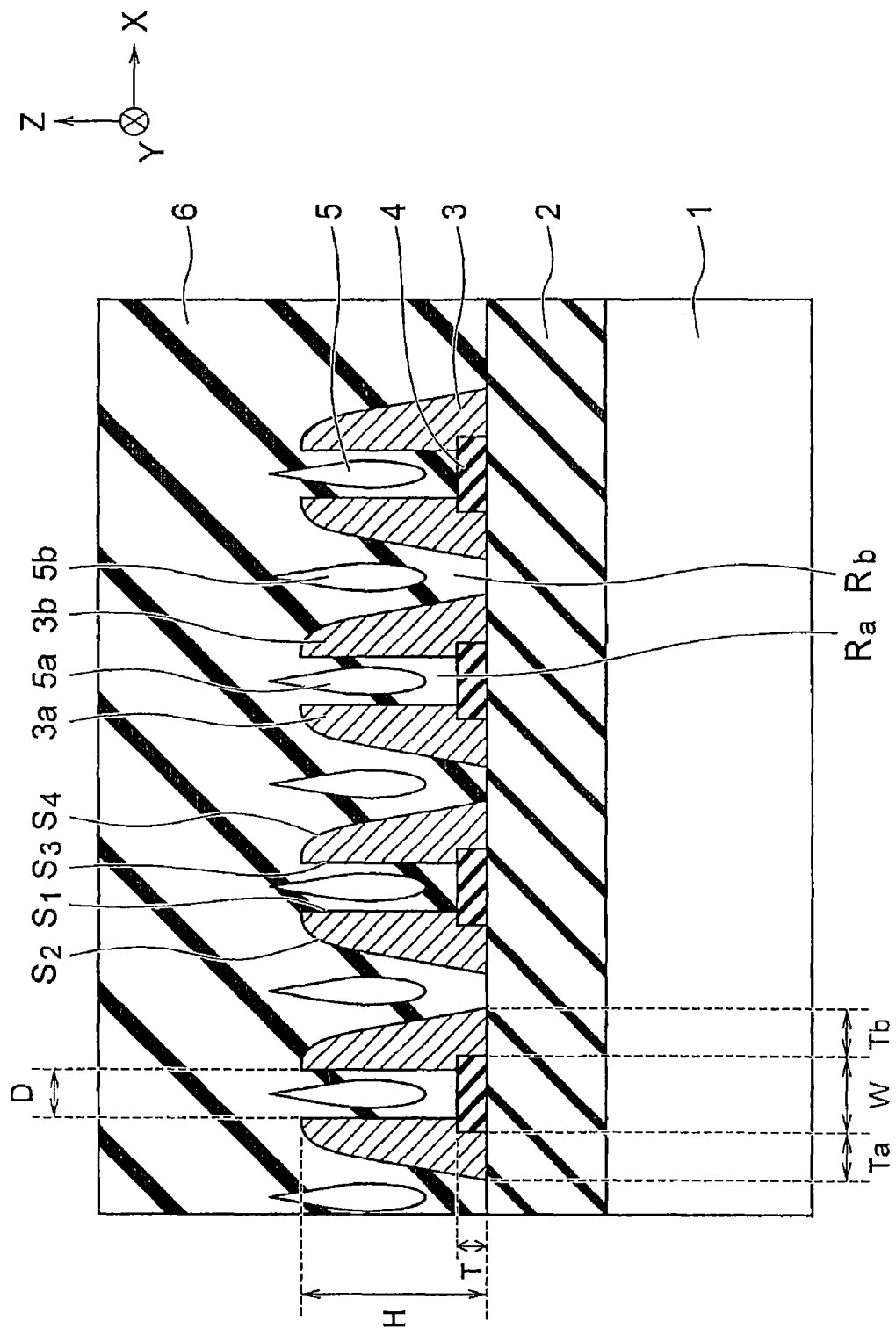
FIG. 8 is a cross sectional view showing a structure of a semiconductor device of a second embodiment.

FIG. 8 is a cross sectional view showing a structure of a semiconductor device of a second embodiment.

In the present embodiment, each of the second insulators 4 protrudes to lower portions of the first and second interconnects 3a and 3b. As a result, the width "W" of the second insulators 4 is set to be larger than a distance "D" between the first and third side surfaces $S_1$ and $S_3$ above the second insulators 4.

Such a structure can be achieved by making the slimming amount of the second insulators 4 smaller than the slimming amount of the sacrificial layers 11 in the step of FIG. 5A. The slimming amounts can be controlled by adjusting the concentration of the solution and the slimming time. Through the step of FIG. 5A, the width of the second insulators 4 becomes larger than the width of the sacrificial layers 11.

According to the present embodiment, contact areas between the second insulators 4 and the sidewall interconnects 3 increase, so that it is possible to prevent the falling of the sidewall interconnects 3 more effectively.

If the width "W" of the second insulators 4 is too large, the resistances of the sidewall interconnects 3 may become too high. Accordingly, when "D" is equal to 1 and "Ta+W+Tb" is equal to 3, it is preferred that the value of "W" is set at 1 to 2 (therefore, "Ta" and "Tb" shown in FIG. 8 take values of 0.5 to 1) in the present embodiment. However, the sizes "W", "Ta" and "Tb" may take values different from those in this example in response to the materials and the shapes of the sidewall interconnects 3 and the second insulators 4.

Figure 9:
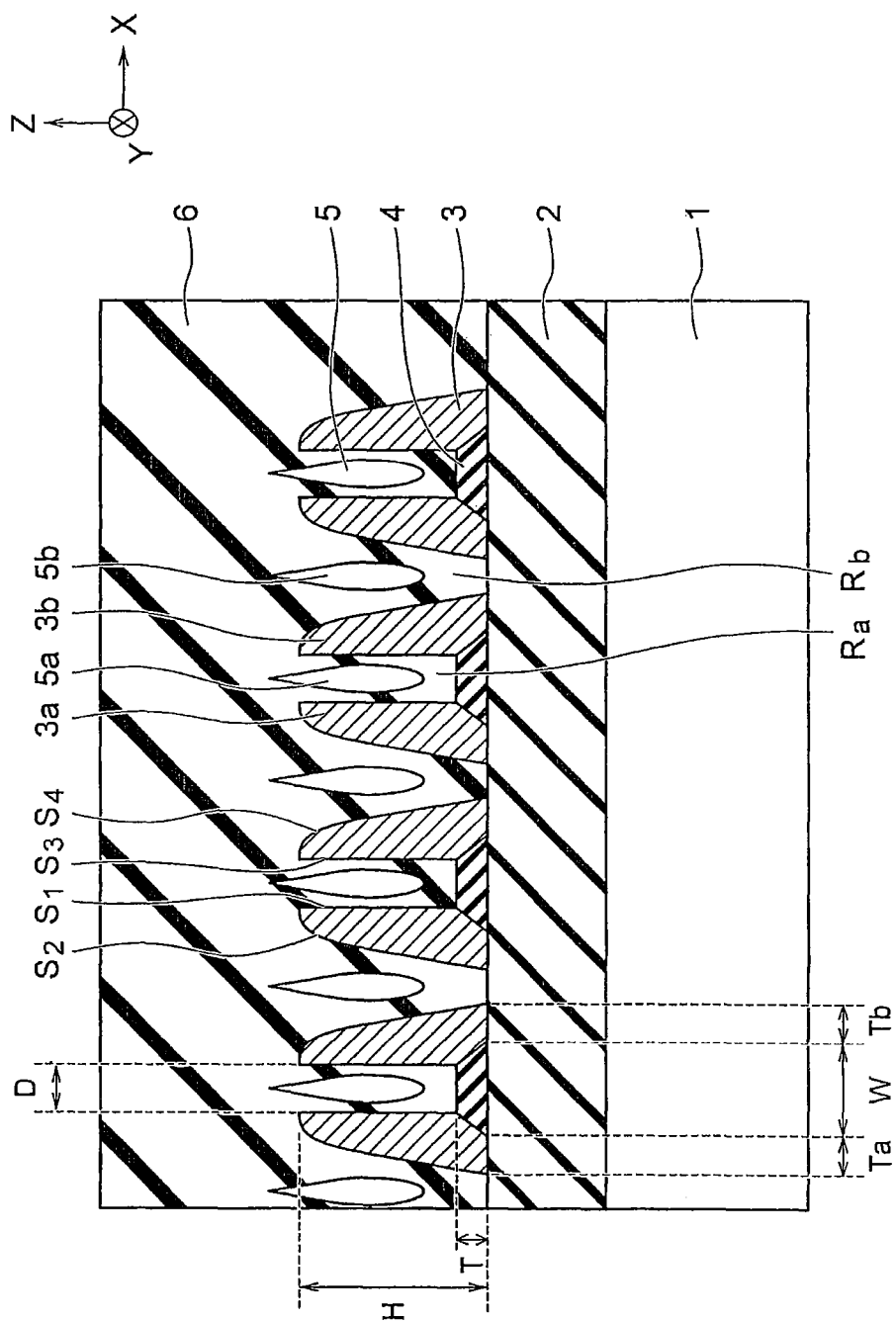
FIG. 9 is a cross sectional view showing a structure of a semiconductor device of a modification of the second embodiment.

FIG. 9 is a cross sectional view showing a structure of a semiconductor device of a modification of the second embodiment.

In FIG. 9, each second insulator 4 protrudes to the lower portions of the first and second interconnects 3a and 3b in the same way as in FIG. 8. However, the side surfaces of the second insulators 4 in FIG. 9 have taper shapes. Such a structure can be achieved by slimming the second insulators 4 so that the side surfaces of the second insulators 4 have the taper shapes in the step of FIG. 5A. In the present modification, contact areas between the second insulators 4 and the sidewall interconnects 3 increase, so that it is possible to prevent the falling of the sidewall interconnects 3 more effectively.

As described above, each second insulator 4 in the present embodiment protrudes to the lower portions of the first and second interconnects 3a and 3b. Therefore, according to the present embodiment, it becomes possible to effectively prevent the falling of the sidewall interconnects 3 as compared with the first embodiment.

Third Embodiment

Figure 10:
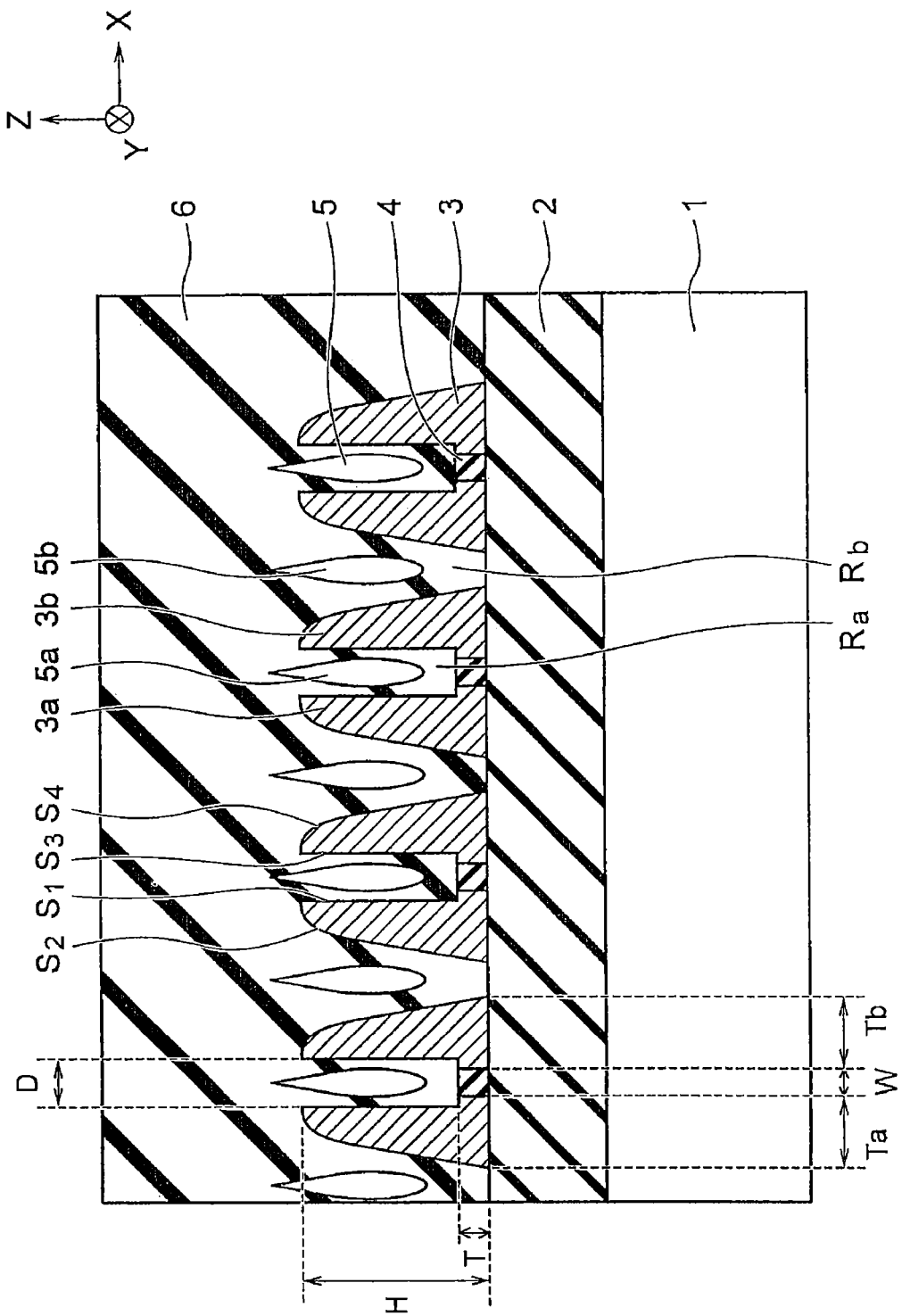
FIG. 10 is a cross sectional view showing a structure of a semiconductor device of a third embodiment.

FIG. 10 is a cross sectional view showing a structure of a semiconductor device of a third embodiment.

In the present embodiment, the first and second interconnects 3a and 3b protrude to bottom portions of trenches between those interconnects 3a and 3b. As a result, the width "W" of the second insulators 4 is set to be smaller than the distance "D" between the first and third side surfaces $S_1$ and $S_3$ above the second insulators 4.

Such a structure can be achieved by making the slimming amount of the second insulators 4 larger than the slimming amount of the sacrificial layers 11 in the step of FIG. 5A. Through the step of FIG. 5A, the width of the second insulators 4 becomes smaller than the width of the sacrificial layers 11.

According to the present embodiment, the cross sections of the sidewall interconnects 3 increase, so that it is possible to reduce the resistances of the sidewall interconnects 3.

If the width "W" of the second insulators 4 is too small, the first and second interconnects 3a and 3b may be short-circuited. Accordingly, when "D" is equal to 1 and "Ta+W+Tb" is equal to 3, it is preferred that the value of "W" is set at 0.5 to 1 (therefore, "Ta" and "Tb" shown in FIG. 10 take values of 1 to 1.25) in the present embodiment. However, the sizes "W", "Ta" and "Tb" may take values different from those in this example in response to the materials and the shapes of the sidewall interconnects 3 and the second insulators 4.

Figure 11:
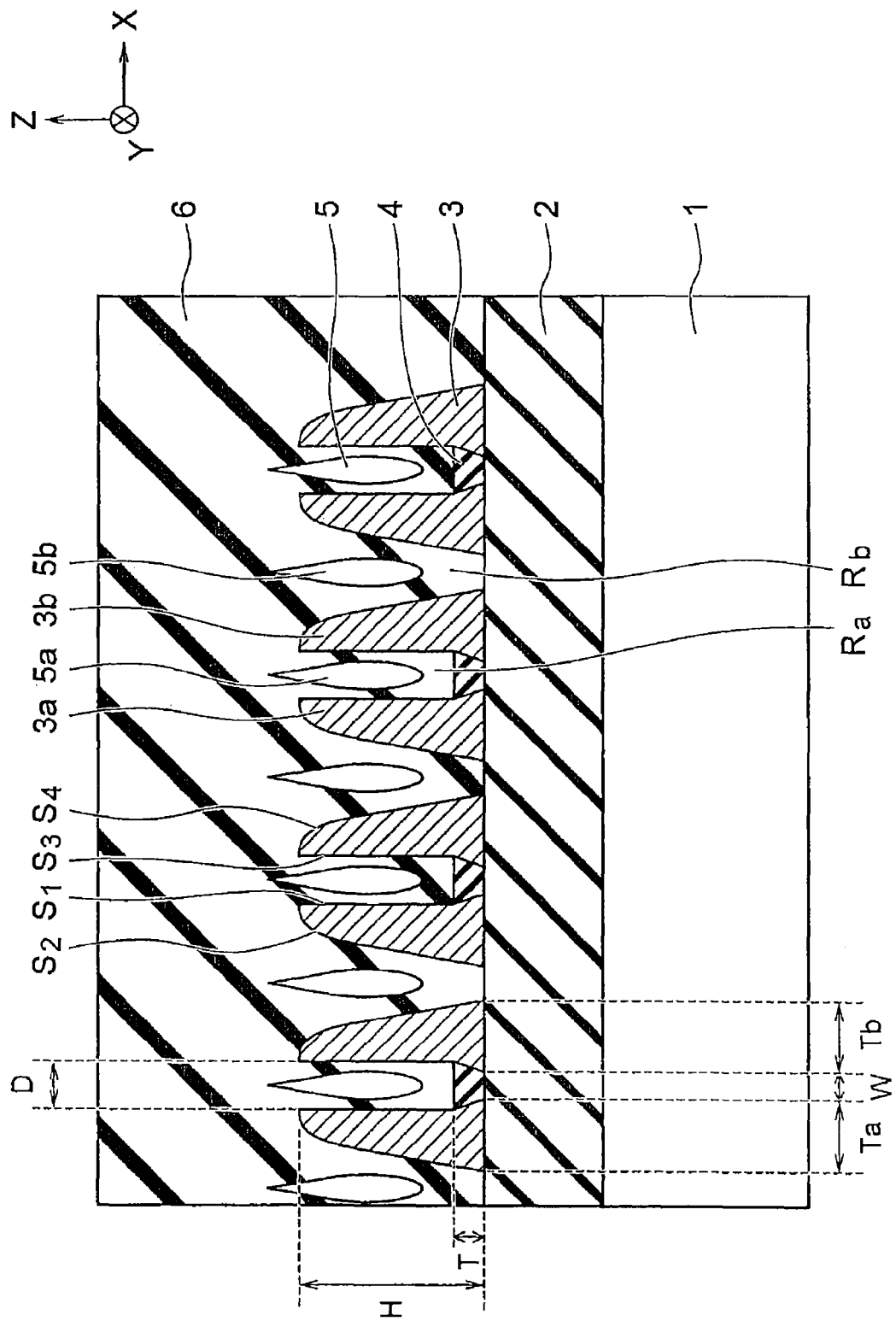
FIG. 11 is a cross sectional view showing a structure of a semiconductor device of a modification of the third embodiment.

FIG. 11 is a cross sectional view showing a structure of a semiconductor device of a modification of the third embodiment.

In FIG. 11, the first and second interconnects 3a and 3b protrude to the bottom portions of the trenches between those interconnects 3a and 3b in the same way as in FIG. 10. However, the side surfaces of the second insulators 4 in FIG. 11 have taper shapes. Such a structure can be achieved by slimming the second insulators 4 so that the side surfaces of the second insulators 4 have the taper shapes in the step of FIG. 5A. In the present modification, the cross sections of the sidewall interconnects 3 increase, so that it is possible to reduce the resistances of the sidewall interconnects 3.

As described above, the first and second interconnects 3a and 3b in the present embodiment protrude to the bottom portions of the trenches between those interconnects 3a and 3b. Therefore, according to the present embodiment, it becomes possible to reduce the resistances of the sidewall interconnects 3 as compared with the first embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, the method comprising:
    sequentially forming a first insulator, a second insulator, and a sacrificial layer on a semiconductor substrate;
    forming a plurality of core materials formed of the sacrificial layer and the second insulator;
    forming first and second interconnects on side surfaces of each of the core materials to form a plurality of first interconnects and a plurality of second interconnects alternately on the first insulator, each first interconnect having a first side surface in contact with one of the core materials and a second side surface positioned on an opposite side of the first side surface, and each second interconnect having a third side surface in contact with one of the core materials and a fourth side surface positioned on an opposite side of the third side surface; and removing the sacrificial layer so that the second insulator remains, after the first and second interconnects are formed.

2. The method of claim 1, further comprising forming a third insulator on the first and second interconnects to form air gaps between the first and third side surfaces and between the second and fourth side surfaces, after the sacrificial layer is removed.

3. The method of claim 2, further comprising forming a protection layer on the first to fourth surfaces of the first and second interconnects between removing the sacrificial layer and forming the third insulator.

4. The method of claim 1, wherein
each first interconnect comprises a first barrier metal layer exposed to the first side surface and a bottom surface of the first interconnect, and a first interconnect material formed on the first barrier metal layer, and
each second interconnect comprises a second barrier metal layer exposed to the third side surface and a bottom surface of the second interconnect, and a second interconnect material formed on the second barrier metal layer.

5. The method of claim 1, wherein a height of the first and second interconnects is set twice to ten times widths of the first and second interconnects.

6. The method of claim 1, wherein a thickness of the second insulator is set 0.2 to 0.5 times a height of the first and second interconnects.

7. The method of claim 1, wherein the plurality of core materials are formed so that a width of the second insulator becomes larger or smaller than a width of the sacrificial layer.

8. The method of claim 7, wherein the widths of the second insulator and the sacrificial layer are set to suffice $0.5D \leq W < D$ or $D < W \leq 2D$ where W and D denote the widths of the second insulator and the sacrificial layer, respectively.

9. The method of claim 7, wherein the second insulator of each core material is formed to have taper shaped side surfaces.

10. A method of manufacturing a semiconductor device, the method comprising:
sequentially forming first and second insulators on a semiconductor substrate;
forming a plurality of core materials formed of the second insulator;
forming first and second interconnects on side surfaces of each of the core materials to form a plurality of first interconnects and a plurality of second interconnects alternately on the first insulator, each first interconnect having a first side surface in contact with one of the core materials and a second side surface positioned on an opposite side of the first side surface, and each second interconnect having a third side surface in contact with one of the core materials and a fourth side surface positioned on an opposite side of the third side surface; and
partially removing the second layer after the first and second interconnects are formed.

11. The method of claim 10, further comprising forming a third insulator on the first and second interconnects to form air gaps between the first and third side surfaces and between the second and fourth side surfaces, after the second insulator is partially removed.

* * * * *